(12) United States Patent
Guan et al.

(10) Patent No.: US 7,725,159 B2
(45) Date of Patent: *May 25, 2010

(54) HORIZONTAL FIELD MRI SHOULDER COIL

(75) Inventors: Yiping Guan, Aurora, OH (US); Kevin A. Archibald, Cuyahoga Falls, OH (US); Joseph M. Kolecki, Brooklyn, OH (US)

(73) Assignee: Hitach Medical Systems America, Inc., Twinsburg, OH (US)

( * ) Notice: Subject to any disclaimer, the term of this patent is extended or adjusted under 35 U.S.C. 154(b) by 454 days.

This patent is subject to a terminal disclaimer.

(21) Appl. No.: 11/858,945

(22) Filed: Sep. 21, 2007

(65) Prior Publication Data

US 2009/0082663 A1    Mar. 26, 2009

(51) Int. Cl.
*A61B 5/055* (2006.01)

(52) U.S. Cl. ........................... 600/422; 600/421

(58) Field of Classification Search .......... 600/410, 600/422; 378/204; 324/318, 322, 309
See application file for complete search history.

(56) References Cited

U.S. PATENT DOCUMENTS

| | | | |
|---|---|---|---|
| 5,136,244 A | 8/1992 | Jones et al. | |
| 5,143,068 A | 9/1992 | Muennemann et al. | |
| D350,825 S | 9/1994 | Lee | |
| 5,343,862 A * | 9/1994 | Jones | 600/422 |
| 5,351,668 A | 10/1994 | Gatellier | |
| 5,351,688 A * | 10/1994 | Jones | 600/422 |
| 5,361,765 A | 11/1994 | Herlihy et al. | |
| 5,575,287 A | 11/1996 | Eydelman | |
| 6,591,128 B1 | 7/2003 | Wu et al. | |
| 7,031,763 B1* | 4/2006 | Zhang | 600/422 |
| 7,333,849 B1 | 2/2008 | Su et al. | |
| 7,466,130 B1 | 12/2008 | Votruba et al. | |
| 7,545,144 B2 | 6/2009 | Guan et al. | |
| 2004/0030241 A1 | 2/2004 | Green et al. | |
| 2006/0208734 A1 | 9/2006 | Xue et al. | |

OTHER PUBLICATIONS

International Search Report and Written Opinion of the International Searching Authority, International Application No. PCT/US2008/076997, mailed on Dec. 19, 2008.

Y. Hamamura, et al.; An 8 Channel Shoulder Coil for High Resolusion Imaging: Proc. Intl. Soc. Mag. Reson. Med. 14 (2006), p. 419.

* cited by examiner

*Primary Examiner*—Eric F Winakur
*Assistant Examiner*—Nicholas L Evoy
(74) *Attorney, Agent, or Firm*—Ulmer & Berne LLP

(57) ABSTRACT

The present invention relates to a design of a radiofrequency (RF) receive coil (also commonly referred to as an imaging coil) for magnetic resonance imaging (MRI) in a horizontal field MRI system of a patient's shoulder region.

9 Claims, 5 Drawing Sheets

HORIZONTAL FIELD MRI SHOULDER COIL

TECHNICAL FIELD

The invention relates generally to a design of a radiofrequency receive coil designed for magnetic resonance imaging of a patient's anatomy. More specifically, the invention relates to a design of a radiofrequency receive coil for magnetic resonance imaging in a horizontal field magnetic resonance imaging system of a patient's shoulder region.

BACKGROUND OF THE INVENTION

Magnetic resonance imaging (MRI) is a medical diagnostic imaging technique used to diagnose many types of injuries and medical conditions. An MRI system includes a main magnet for generating a main magnetic field through an examination region. The main magnet is arranged such that its geometry defines the examination region. The orientation of the main magnet defines whether the MRI system is classified as a horizontal field system or a vertical field system. In a horizontal field system, the static main magnetic field is typically oriented in the head-foot (H-F) direction relative to the prone/supine patient within the system. In a vertical field system, the static magnetic field is typically oriented in an anterior-posterior (A-P) direction relative to the prone/supine patient within the system.

The main magnetic field causes the magnetic moments of a small majority of the various nuclei within the body to be aligned in a parallel or anti-parallel arrangement. The aligned magnetic moments rotate around the equilibrium axis with a frequency that is characteristic for the nuclei to be imaged. An external radiofrequency (RF) field applied by other hardware within the MRI system perturbs the magnetization from its equilibrium state. Upon termination of the application of the RF pulse, the magnetization relaxes to its initial state. During relaxation the time varying magnetic moment induces a detectable time varying voltage in the receive coil. The time varying voltage is commonly detected by a RF receive coil.

During operation of the RF receive coil, each element within the coil collects information from the time varying voltage induced by the magnetic moments within the anatomy of the patient nearest to that element. The information collected by each element is processed through the electronics within the MRI system on individual channels of the MRI system, which keep the information from each element separate throughout the imaging process. The information from each channel of the system is then processed by reconstruction software integrated with the MRI system to combine the single images from the channels to create a complete image of the anatomy of interest.

One or more RF receive coils, commonly called imaging coils, are typically placed within the vicinity of the patient during imaging. The imaging coil is typically comprised of a series of inductive and capacitive elements and operates by resonating and efficiently storing energy at what is known as the Larmor frequency. The imaging coil is comprised of at least one, and usually more than one element typically made of a continuous piece of copper in a solenoid, loop, butterfly or figure-eight (saddle), or other continuous geometric shape. The elements are positioned at various locations throughout coil to provide for the desired imaging of the patient. The design of the receive coil varies depending on whether it is designed for use within a vertical or horizontal field MRI system.

The shape, configuration and location of elements within the receive coil affect the characteristics of the coil, including the coil sensitivity, signal-to-noise ratio (SNR) and imaging field-of-view. Conventionally, the receive coil's imaging field-of-view (FoV) is defined as the distance between the two points on the coil sensitivity profile, which is a graph of the coil's sensitivity over the distance profile, where the signal drops to 80% of its peak value. The shape and design of the RF receive coil varies depending on the patient anatomy the coil is designed to imagine.

Further developments in MRI include various parallel imaging techniques. An example of a parallel imaging technique is Simultaneous Acquisition of Spatial Harmonics (SMASH). The SMASH technique uses a parallel processing algorithm to exploit spatial information inherent in a surface coil array. The result is an increase in MR image acquisition speed, resolution and/or field of view. In a similar fashion, another parallel processing algorithm is known where the acceleration of image acquisition is performed on the time domain space instead of the frequency domain space. This parallel acquisition technique is referred to as Sensitivity Encoding (SENSE). In SENSE, images are obtained by means of magnetic resonance (MR) of an object placed in a static magnetic field and includes simultaneous measurement of a number of sets of MR signals by application gradients and an array of receiver coils. Reconstruction may bee provided from a number of receiver coil images from the sets of MR signals measured and/or reconstruction of a final image may be from a distant dependent sensitivity of the receiver coils and a first plurality of receiver coil images. The characteristics of all of these parallel imaging techniques is that the acceleration speed is directly proportional to the number of independent receivers along the direction that the image acceleration needs to be applied. Thus, the higher the number of receiver coils, the faster the acceleration speed for acquiring an image with better SNR and improved image quality.

A human shoulder is one of the many types of patient anatomy that is imaged using MRI technology. Imaging a human shoulder includes the visualization of the various parts of the shoulder, including the glenoid fossa, labrum, humeral head, neck and body, supraspinatus, infraspinatus and teres minor insertion (rotator cuff) and surrounding soft tissues. MRI examinations of the shoulder region are often done to visualize rotator cuff tears, labral tears, labral deterioration, and impingement syndrome, among other reasons.

Within the art, numerous attempts have been made to provide designs for RF receive coils for shoulder imaging in a horizontal field MRI system. The existing quadrature coil designs do not provide optimal SNR due to the required separation of the anterior and posterior elements necessary to avoid coupling between the elements of the coil designs. Furthermore, solenoid multi-purpose coils are commonly used for shoulder imaging. This is not ideal because the coil is not designed to give optimal imaging for the shoulder region.

SUMMARY OF THE INVENTION

The present invention relates to a design of a radiofrequency (RF) receive coil (also commonly referred to as an imaging coil) for magnetic resonance imaging (MRI) in a horizontal field MRI system of a patient's shoulder region. The shoulder coil design includes five elements that are encased within a housing. The element and housing designs are shaped to encompass and fit in close proximity to the human shoulder region. A preferred embodiment of the shoulder coil design includes five elements: a solenoid element two saddle elements and two loop elements. It is foreseen that in further embodiments, additional elements can be added to the design to provide increased signal for higher field MRI systems. For example, an additional saddle element and two additional loop elements can be added to the design to create an eight element design for use in a higher field MRI system.

It is an object of this invention to provide a design for a RF receive coil for MR imaging of a patient's shoulder region in a horizontal field MRI system.

These and other objects of the present invention will become more readily apparent from a reading of the following detailed description taken in conjunction with the accompanying drawings wherein like reference numerals indicate similar parts, and with further reference to the appended claims.

BRIEF DESCRIPTION OF THE DRAWINGS

The preferred embodiment of the invention, illustrative of the best mode in which applicant has contemplated applying the principals is set forth in the following description and is shown in the drawings and is particularly and distinctly pointed out and set forth in the appended claims. The invention may take physical form in certain parts and arrangements of parts, numerous embodiments of which will be described in detail in the specification and illustrated in the accompanying drawings which form a part hereof, and wherein:

DETAILED DESCRIPTION OF THE INVENTION

Figure 1:
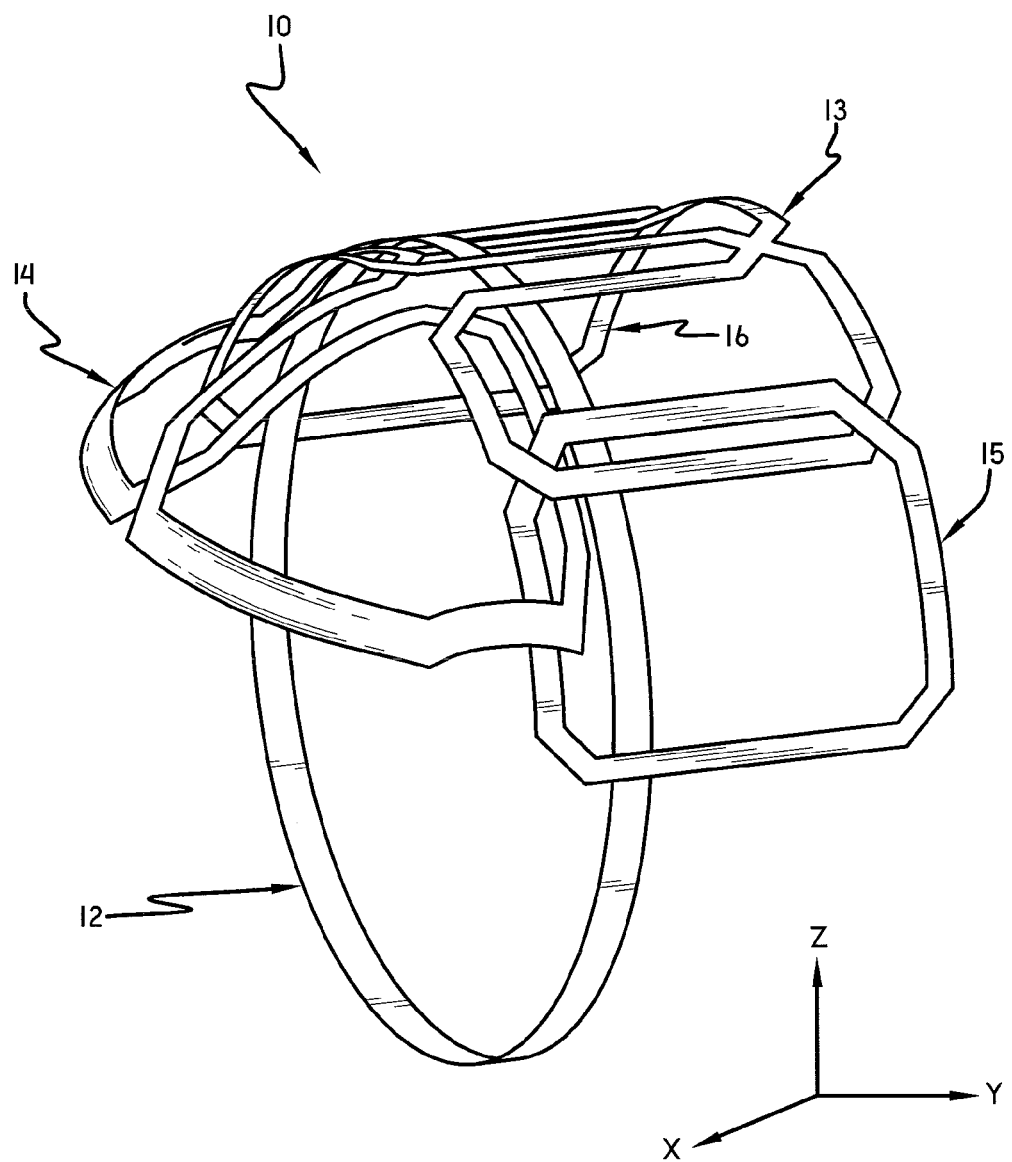
FIG. 1 is a front perspective view of a five-element design of an embodiment of the shoulder coil of the present invention.

Referring now to the drawings wherein the showings are for purposes of illustrating numerous embodiments of the invention only and not for purposes of limiting the same, the figures illustrate the novel idea of a design of a radiofrequency (RF) receive coil (also commonly referred to as an imaging coil) for magnetic resonance imaging (MRI) in a horizontal field MRI system of a patient's shoulder region. When referring to the shoulder region, the patient's shoulder region will include three main areas: the superior section (the top of the patient's shoulder), the anterior section (the front of the patient's shoulder) and the posterior section (the back of the patient's shoulder).

Figure 2:
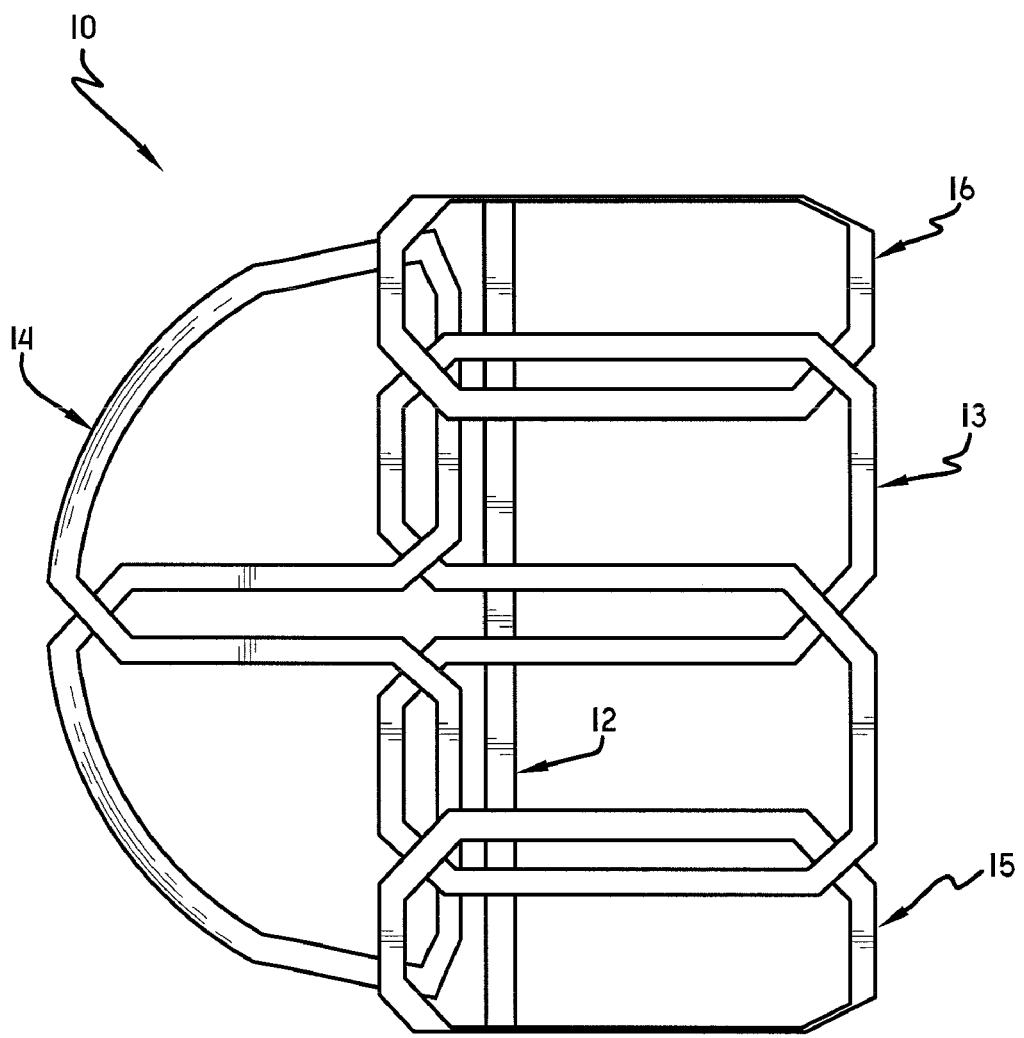
FIG. 2 is a top elevational view of a five-element design of an embodiment of the shoulder coil of the present invention.

Referring to FIG. 1 and FIG. 2, a preferred embodiment of coil 10 has a five element design. Solenoid element 12 is positioned to wrap around the patient's shoulder, encompassing the superior, anterior and posterior sections of the patient's shoulder. Saddle element 13 and saddle element 14 are positioned over the superior section of the shoulder. Loop element 15 and loop element 16 are positioned over the anterior and posterior sections of the patient's shoulder, and are arranged to be generally symmetrically located around saddle element 13.

Figure 3:
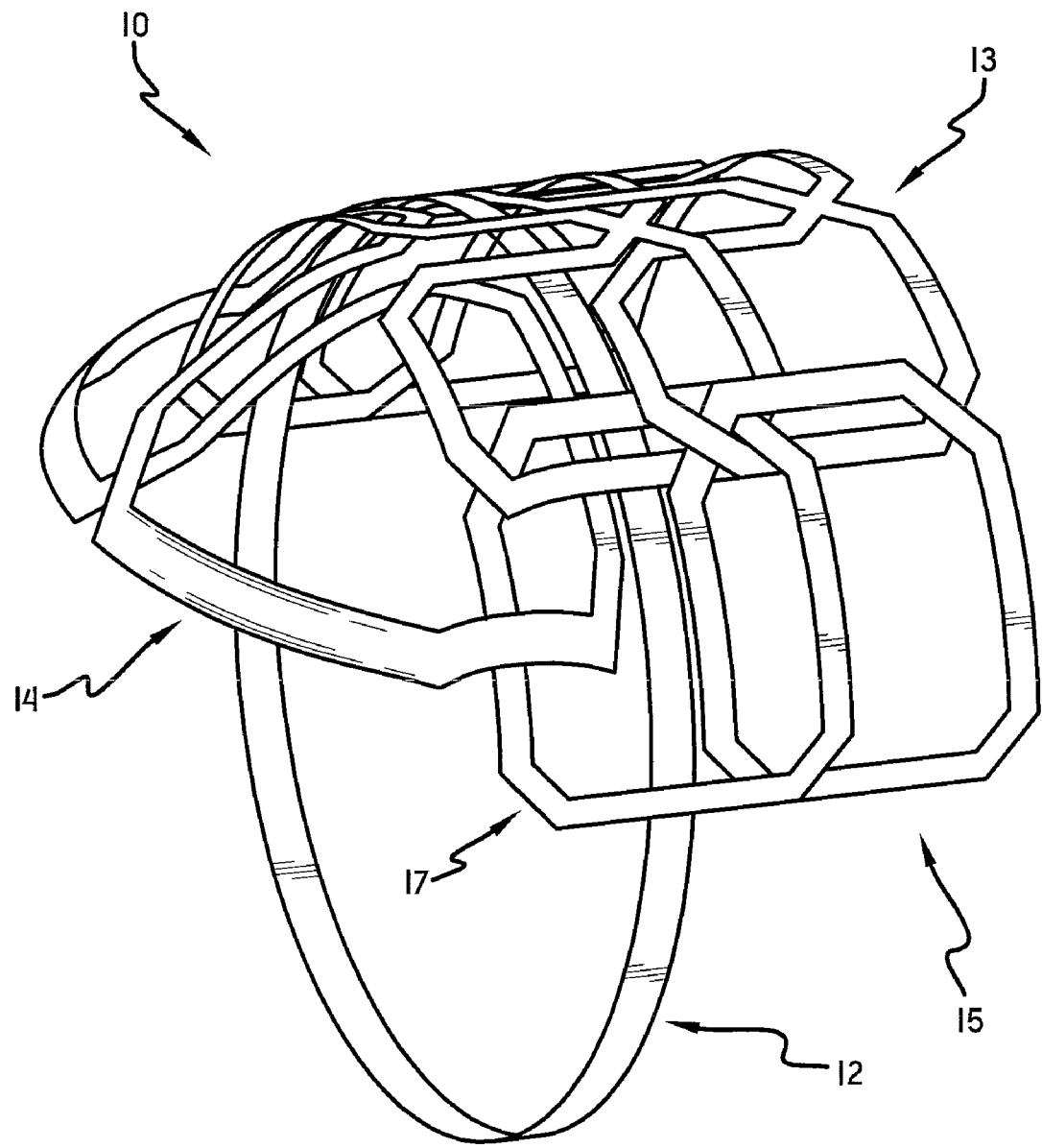
FIG. 3 is a front perspective view of an eight-element design of an embodiment of the shoulder coil of the present invention.
Figure 4:
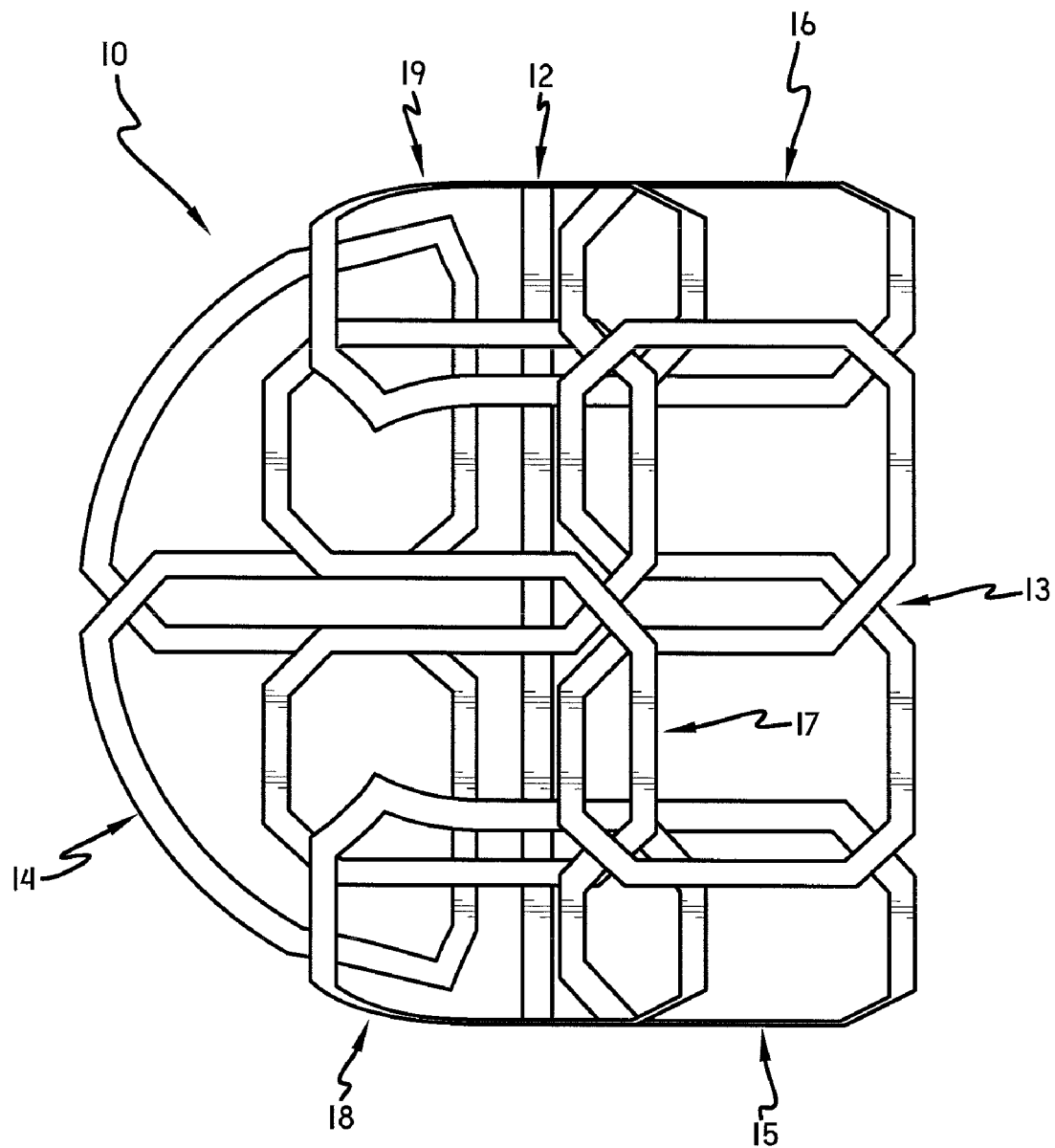
FIG. 4 is a top elevational view of an eight-element design of an embodiment of the shoulder coil of the present invention.

It is foreseen in further embodiments of the present invention that additional elements can be added to the above described five-element design for improved performance on higher field systems. FIGS. 3-4 illustrate an embodiment of the present invention having additional elements. The embodiment illustrated in FIGS. 3-4 is an eight-element design, using the same five elements as were used in the five-element design illustrated in FIGS. 1-2. The eight-element design uses additional saddle element 17, positioned to overlap saddle element 13 and saddle element 14. The eight-element design further uses additional loop element 18 and additional loop element 19, which are positioned over the anterior and posterior sections of the patient's shoulder, such that loop element 18 overlaps loop element 15 and loop element 19 overlaps loop element 16.

The design of an embodiment of the coil of the present invention includes at least one solenoid element that extends around the shoulder, positioned over the superior, anterior and posterior sections of the shoulder. The coil further includes at least one saddle element that is positioned over the superior section of the shoulder. The coil yet further includes at least one anterior loop element positioned over the anterior section of the shoulder and at least one posterior loop element positioned over the posterior section of the shoulder. It is foreseen by the invention that further elements can be added to the basic design of the coil, to improve the performance of the coil on the system the coil is designed to operate in conjunction with.

Figure 5:
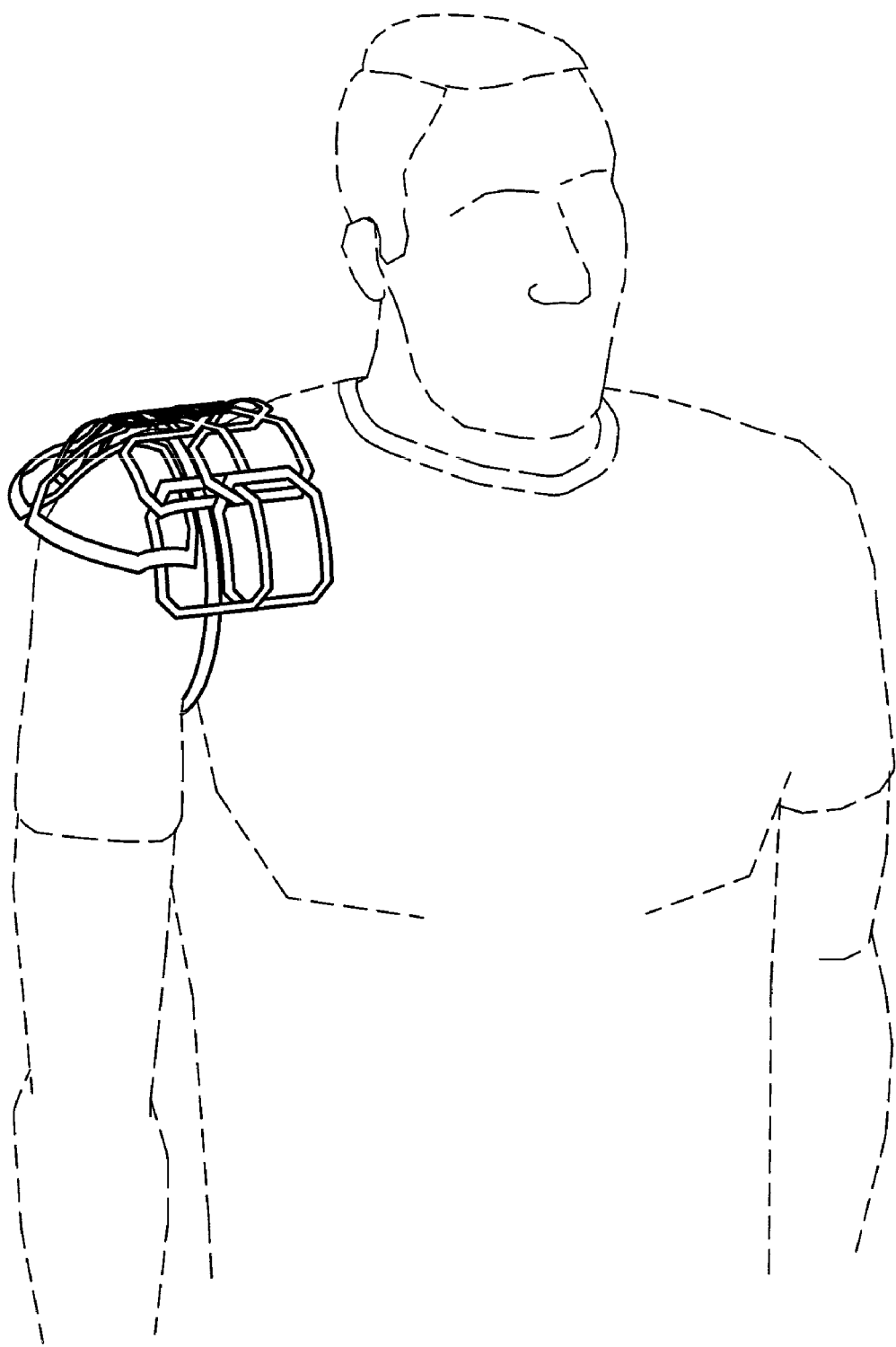
FIG. 5 is a perspective view of a five-element design of an embodiment of the shoulder coil of the present invention positioned on a patient.

Proper positioning of shoulder coil 10 on patient's shoulder region 36 is illustrated in FIG. 5. While the five-element coil is illustrated in FIG. 5, it is understood by one commonly skilled in the art that the eight element coil, or the coil using any number of elements would be similarly positioned. When coil 10 is properly positioned on a patient's anatomy for MR imaging of shoulder region 36 using coil 10, solenoid element 12 is positioned around the patient's shoulder, such that patient's arm 38 fits through the center of solenoid element 12, with the element wrapping over shoulder 36 and below the armpit. Solenoid element 12 encompasses superior section 30, anterior section 32 and posterior section 34 of patient's shoulder region 36. Saddle element 13 is positioned over superior section 30 of shoulder region 36 near the patient's neck, perpendicular to solenoid element 12. Saddle element 14 is positioned over superior section 30 of shoulder 36, wrapping slightly over shoulder 36 onto the patient's upper arm area. Loop element 15 is positioned over anterior section 32 of patient's shoulder region 36, and loop element 16 is positioned over posterior section 34 of patient's shoulder region 36.

It is also understood by one commonly skilled in the art that while FIG. 5 illustrates the coil positioned over the patient's right shoulder, the coil design of this invention can be utilized to image either the right or the left shoulder of the patient. The coil is positioned in the reverse manner to fit over the left shoulder. The patient's left arm extends through solenoid element 12. Saddle elements 13 and 14 remain positioned on the top of the patient's shoulder region. However, loop elements 15 and 16 are reversed in orientation, such that loop element 15 is positioned over the posterior of the patient's shoulder rather than the anterior, and loop element 16 is positioned over the anterior of the patient's shoulder rather than the posterior.

The design of the shoulder coil of the present invention offers many advantages over past designs. The element design provides for optimum imaging capabilities of the shoulder coil. Solenoid element 12 of the design provides for penetration in the middle region of the patient's shoulder, as well as provides left-right coverage of the shoulder region. Saddle elements 13 and 14 contribute SNR in the top shoulder area and further enhance the left-right coverage of the shoulder region, especially where the contribution of solenoid element 12 begins to drop. Loop elements 15 and 16 improve the SNR and coverage in the anterior and posterior portions of the shoulder region of the patient. Furthermore, the number of elements used in the coil design offers parallel imaging capabilities in all three directions (right-left, anterior-posterior, superior-inferior).

The elements in the design of the shoulder coil are commonly formed using copper tape, as is known by one ordinarily skilled in the art. The elements can be constructed using a continuous single piece of copper tape, or may be formed using many pieces of copper tape electrically connected to form a continuous signal path. The width, thickness and number of turns of copper tape used are chosen for optimized sensitivity of the coil, as is commonly known in the art. The elements may be, but are not necessarily, mounted on a frame structure to support the elements and ensure the elements are not bent or repositioned during imaging use of the coil. The frame structure will commonly be constructed of a plastic material. The frame may be flexible enough to prevent cracking of the frame or elements during use of the coil, however should return to its original shape when flexed. The design may also include electronic components in electrical connection with the elements of the design. These electronic components transmit the signal generated within the coil to the other components of the MR system to create the desired images of the patient.

The shoulder coil design of the present invention will commonly be enclosed in a housing structure. While the housing structure is not limited to any particular design, the housing structure will commonly be constructed of a flexible material, such as a foam, rubberized polymer, or other similar material. There is no limitation, however, that the housing must be flexible, as the housing may also be constructed from a rigid material such as a hard plastic. The housing will be of any material that can adequately protect the internal elements and associated electronics of the coil from any external pollutants such as moisture, dust and the like, with the only limitation being that the material used to construct the housing must not affect the MR images created by the coil.

The housing may be created from more than one type of material. For example, the housing may be constructed from a flexible foam, and also covered in a second material such as a vinyl or plastic that allows for easy cleaning of the coil. Furthermore, a different material may be used to house the more sensitive electronics of the coil, such that while flexible foam is used for the main body of the coil housing, a rigid plastic may be used to protect the electronics located at a centralized location of the coil. In most embodiments the housing structure will be shaped to confirm with not only the design of the shoulder coil of this invention, but also to the general shape of the patient's shoulder to provide a comfortable fit during imaging of the patient.

In a preferred embodiment of the design of this invention, the coil of this design can be used to image a significant majority of patient's shoulder regions, as opposed to coils of previous designs that required different sized coils to obtain optimal imaging of patients. It is foreseen however, that a larger or smaller size coil may be created using the design of this invention to provide optimal imaging for very large or very small patients.

Described herein is a magnetic resonance imaging radiofrequency receive coil for imaging a human shoulder of a patient. The shoulder includes a superior section, an anterior section and a posterior section. The coil includes at least one solenoid element wherein the at least one solenoid element extends around the shoulder. In certain embodiments the at least one solenoid element extends around the shoulder such that an arm of the patient extends through the center of the at least one solenoid element. The coil further includes at least one saddle element wherein the at least one saddle element is positioned over the superior section of the shoulder. The coil yet further includes at least one anterior loop element wherein the at least one anterior loop element is positioned over the anterior section of the shoulder. The coil yet further includes at least one posterior loop element wherein the at least one posterior loop element is positioned over the posterior section of the shoulder.

Also described herein is a magnetic resonance imaging radiofrequency receive coil for imaging a human shoulder of a patient. The shoulder includes a superior section, an anterior section and a posterior section. The coil includes a solenoid element wherein the solenoid element extends around the shoulder. In certain embodiments of the invention the solenoid element extends around the shoulder such that an arm of the patient extends through the center of the solenoid element. The coil further includes a first saddle element and a second saddle element wherein the first saddle element and the second saddle elements are positioned over the superior section of the shoulder. In certain embodiments of the invention the first saddle element is positioned over the superior section of the shoulder such that the first saddle element is positioned near the patient's neck. In certain embodiments of the invention the second saddle element is positioned over the superior section of the shoulder such that a portion of the second saddle element wraps over a portion of the patient's arm. The coil further includes a first loop element wherein the first loop element is positioned over the anterior section of the shoulder; and a second loop element wherein the second loop element is positioned over the posterior section of the shoulder.

Also described herein is a magnetic resonance imaging radiofrequency receive coil for imaging a human shoulder of a patient. The shoulder includes a superior section, an anterior section and a posterior section. The coil includes a solenoid element wherein the solenoid element extends around the shoulder. In certain embodiments the solenoid element extends around the shoulder such that an arm of the patient extends through the center of the solenoid element. The coil further includes a first saddle element, a second saddle element and a third saddle element wherein the first saddle element, the second saddle element, and the third saddle element are positioned over the superior section of the shoulder. In certain embodiments of the invention at least one of the first saddle element, the second saddle element and the third saddle element is positioned such that it overlaps at least one other of the first saddle element, the second saddle element and the third saddle element. The coil further includes a first loop element and a second loop element wherein the first loop element and the second loop element are positioned over the anterior section of the shoulder. In certain embodiments of the invention the first loop element is positioned such that it overlaps the second loop element. The coil further includes a third loop element and a fourth loop element wherein the third loop element and the fourth loop element are positioned over said posterior section of the shoulder. In certain embodiments of the invention the third loop element is positioned such that it overlaps the fourth loop element.

In the foregoing description, certain terms have been used for brevity, clearness, illustration and understanding; but no unnecessary limitations are to be implied therefrom beyond the requirements of the prior art, because such terms are used for descriptive purposes and are intended to be broadly construed. Moreover, this invention has been described in detail with reference to specific embodiments thereof, including the respective best modes for carrying out each embodiment. It shall be understood that these illustrations are by way of example and not by way of limitation.

What is claimed is:

1. A magnetic resonance imaging radiofrequency receive coil for imaging a human shoulder of a patient, said shoulder having a superior section, an anterior section and a posterior section, said coil comprising:
   (a) a solenoid element wherein said solenoid element is configured to extend around said shoulder;
   (b) a first saddle element and a second saddle element wherein said first saddle element and said second saddle elements are configured for positioning over said superior section of said shoulder;
   (c) a first loop element wherein said first loop element is configured for positioning over said anterior section of the shoulder; and
   (d) a second loop element wherein said second loop element is configured for positioning over said posterior section of the shoulder.

2. The receive coil of claim 1, wherein said solenoid element is configured to extend around said shoulder such that an arm of the patient extends through the center of said solenoid element.

3. The receive coil of claim 1, wherein said first saddle element is configured for positioning over said superior section of said shoulder such that said first saddle element is positioned near said patient's neck.

4. The receive coil of claim 1, wherein said second saddle element is configured for positioning over said superior section of said shoulder such that a portion of said second saddle element wraps over a portion of said patient's arm.

5. A magnetic resonance imaging radiofrequency receive coil for imaging a human shoulder of a patient, said shoulder having a superior section, an anterior section and a posterior section, said coil comprising:
   (a) a solenoid element wherein said solenoid element is configured to extend around said shoulder;
   (b) a first saddle element, a second saddle element and a third saddle element wherein said first saddle element, said second saddle element, and said third saddle element are configured for positioning over said superior section of said shoulder;
   (c) a first loop element and a second loop element wherein said first loop element and said second loop element are configured for positioning over said anterior section of the shoulder; and
   (d) a third loop element and a fourth loop element wherein said third loop element and said fourth loop element are configured for positioning over said posterior section of the shoulder.

6. The receive coil of claim 5, wherein said solenoid element is configured to extend around said shoulder such that an arm of the patient extends through the center of said solenoid element.

7. The receive coil of claim 5, wherein at least one of said first saddle element, said second saddle element and said third saddle element is positioned such that it overlaps at least one other of said first saddle element, said second saddle element and said third saddle element.

8. The receive coil of claim 5, wherein said first loop element is positioned such that it overlaps said second loop element.

9. The receive coil of claim 5, wherein said third loop element is positioned such that it overlaps said fourth loop element.

* * * * *